United States Patent
Jeon et al.

(10) Patent No.: US 7,440,576 B2
(45) Date of Patent: *Oct. 21, 2008

(54) APPARATUS AND METHOD FOR RECONSTRUCTING HIGH FREQUENCY PART OF SIGNAL

(75) Inventors: Seung-hun Jeon, Seoul (KR); Andrey Sergeevich Petukhov, Moscow (RU); Vladimir Alexandrovich Sviridenko, Moscow (RU); Tatiana Mikhailovna Udina, Zelenograd (RU)

(73) Assignee: Samsung Electronics Co., Ltd., Suwon (KR)

( * ) Notice: Subject to any disclaimer, the term of this patent is extended or adjusted under 35 U.S.C. 154(b) by 842 days.

This patent is subject to a terminal disclaimer.

(21) Appl. No.: 10/804,217

(22) Filed: Mar. 19, 2004

(65) Prior Publication Data

US 2005/0036633 A1    Feb. 17, 2005

(30) Foreign Application Priority Data

Mar. 28, 2003 (RU) ............................. 2003108508

(51) Int. Cl.
*H03G 3/00* (2006.01)
*H03G 5/00* (2006.01)

(52) U.S. Cl. .......................................... 381/61; 381/98
(58) Field of Classification Search ............... 381/97, 381/98, 61, 27, 103; 700/94
See application file for complete search history.

(56) References Cited

U.S. PATENT DOCUMENTS

| 4,972,489 | A * | 11/1990 | Oki et al. ................. 381/97 |
| 5,917,917 | A * | 6/1999 | Jenkins et al. ............. 381/63 |
| 5,926,065 | A * | 7/1999 | Wakai et al. .............. 329/304 |
| 6,680,972 | B1 * | 1/2004 | Liljeryd et al. ............ 375/240 |
| 6,711,214 | B1 * | 3/2004 | Hershberger .............. 375/285 |
| 7,184,556 | B1 * | 2/2007 | Johnson et al. ............. 381/61 |

* cited by examiner

*Primary Examiner*—Vivian Chin
*Assistant Examiner*—George C Monikang
(74) *Attorney, Agent, or Firm*—Sughrue Mion, PLLC

(57) ABSTRACT

Provided is an apparatus and method for reconstructing the high frequency part of audio signal to improve the quality of the audio signal. The apparatus includes a frequency inverter which inverts the frequency of an input signal; a band-pass filter which filters the high frequency part of the inverted signal; a converter which shifts the frequency of the filtered signal so as not to generate aliasing of the input signal and the filtered signal; and an adder which adds the shifted signal to the input signal. Therefore, hearing perception close to the original signal can be achieved.

15 Claims, 5 Drawing Sheets

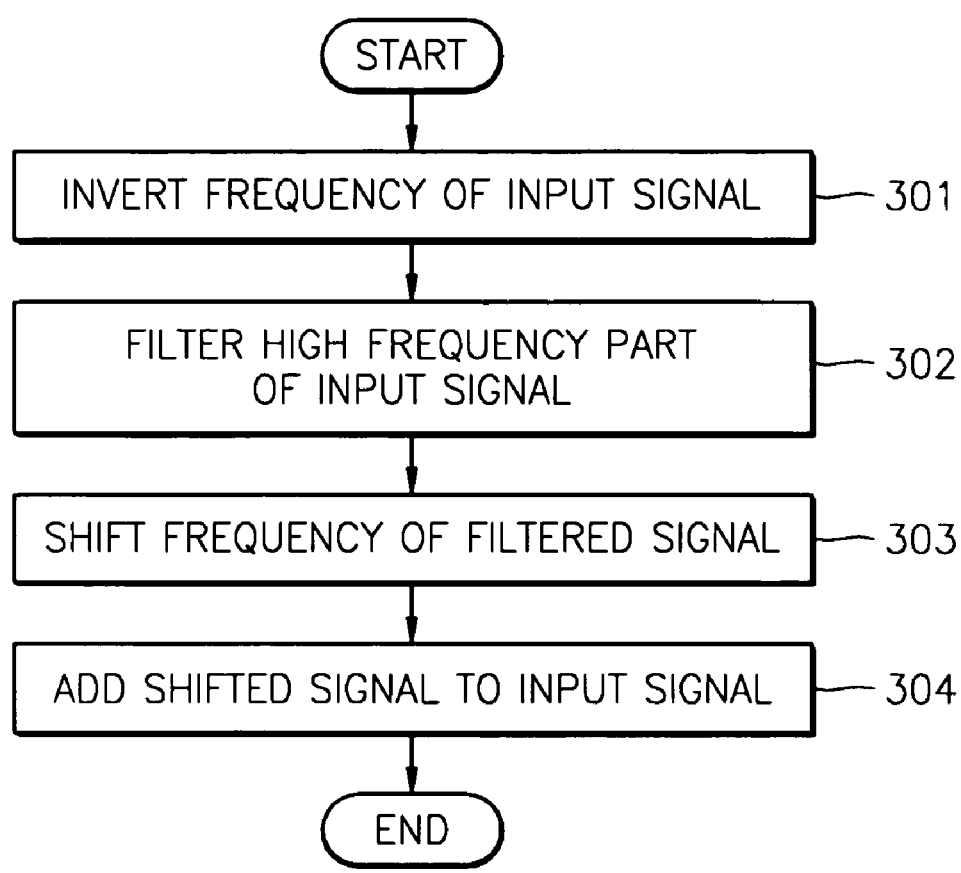

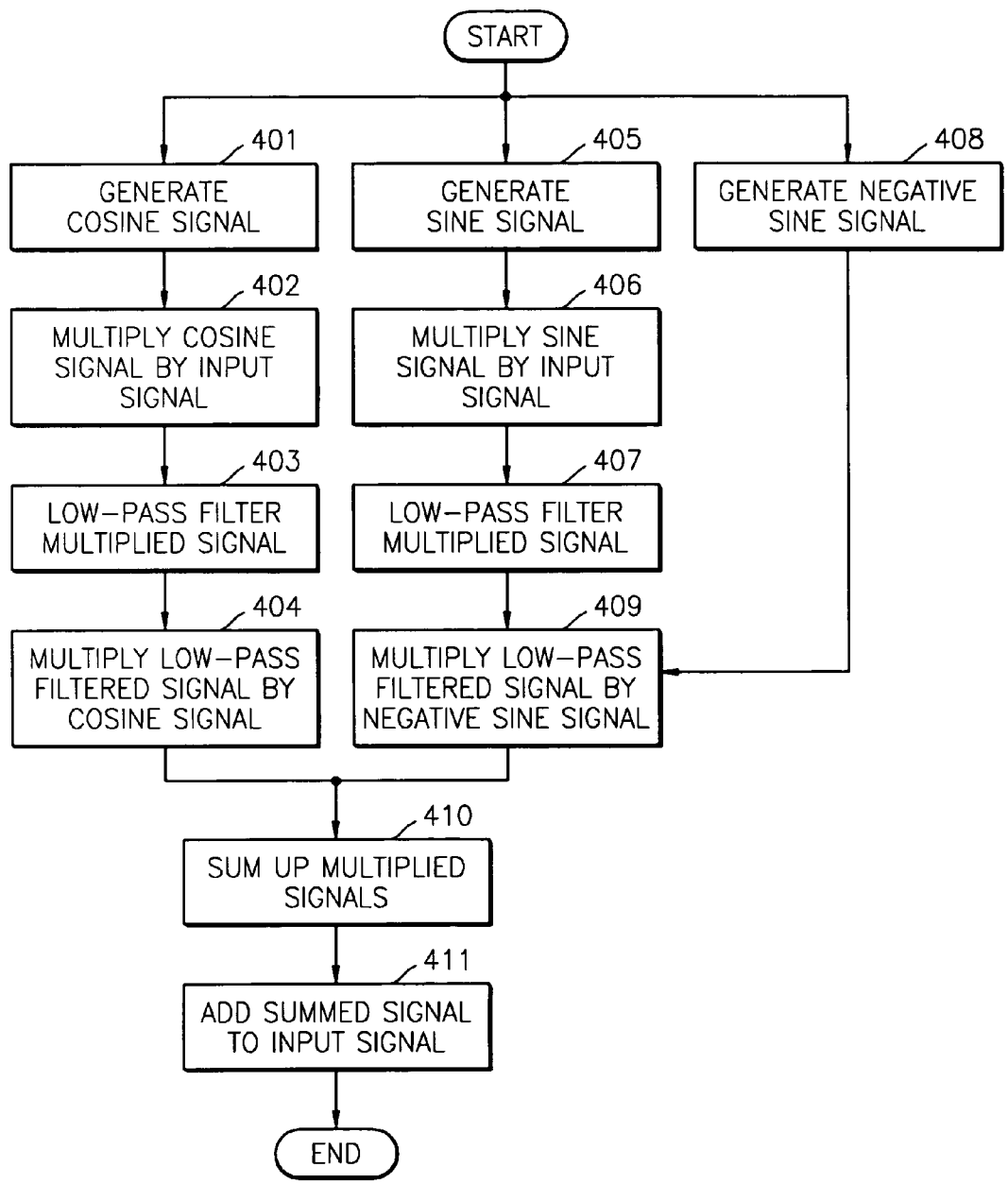

US 7,440,576 B2

APPARATUS AND METHOD FOR RECONSTRUCTING HIGH FREQUENCY PART OF SIGNAL

BACKGROUND OF THE INVENTION

This application claims the priority of Russian Patent Application No. 2003108508, filed on Mar. 28, 2003, in the Russian Intellectual Property Office, the disclosure of which is incorporated herein in its entirety by reference.

1. Field of the Invention

Apparatuses and methods consistent with the present invention relate to multimedia and radio electronics, and more particularly, to methods and apparatuses for reconstructing the high frequency part of an audio signal to improve the quality of the audio signal.

2. Description of the Related Art

There are known methods and systems to increase the quality of audio signal, perceptible by an audience, by recovering the characteristics of the high frequency part, which were lost during transmission in channels with low carrying capacity or during encoding. The method of reconstructing missed information in an audio signal, described in Pat. No. RU 2,194,361, provides for the use of a special encoding system and digital data decoding, wherein digital data are divided on blocks of digits in decreasing order of significance of digit position, and allows reconstructing the structure of the blocks with enough accuracy.

The more simple methods are based on generation of a correcting signal by processing the remaining low-frequency part and adding the correcting signal to the original signal. For example, U.S. Pat. Nos. 6,335,973 and 6,023,513 propose to perform the generation of high-frequency harmonic from the low-frequency part of the signal. Usually, nonlinear transformations are used for this purpose. Also known is high-frequency part generation based on a high frequency noise generator, in which noise parameters are selected by an analysis of the low-frequency part of the signal (see U.S. Pat. No. 5,754,666). However, a method is described in U.S. Pat. No. 5,893,068 to perform signal transfer in the frequency domain by Fourier transformation. High-frequency addition is achieved from an expansion of the low-frequency part of a spectrum. Nevertheless, due to hearing peculiarities and namely due to the fact that the frequency resolution of the ear decreases with the sound frequency increase, simple expansion or spectrum shift will not allow for hearing perception close to the original signal.

SUMMARY OF THE INVENTION

The present invention provides an apparatus and method for reconstructing a high frequency part of an audio signal to obtain hearing perception close to the original signal.

According to an aspect of the present invention, there is provided an apparatus for reconstructing a high frequency part of a first signal, the apparatus comprising: a frequency inverter which inverts a frequency of an input signal; a band-pass filter which filters the high frequency part of the frequency-inverted input signal; a converter which shifts the frequency of the filtered signal so as not to generate aliasing of the input signal and the filtered signal; and an adder which adds the frequency-shifted signal to the input signal.

According to another aspect to the present invention, there is provided an apparatus for reconstructing a high frequency part of second signal, the apparatus comprising: a first generator which generates a cosine signal; a first multiplier which multiplies an input signal by the cosine signal; a first low-pass filter which low-pass filters the multiplied signal; and a second multiplier which multiplies the low-pass filtered signal by the cosine signal.

According to still another aspect of the present invention, there is provided a method of reconstructing a high frequency part of a first signal, the method comprising: inverting a frequency of an input signal; filtering a high frequency part of the frequency-inverted input signal; shifting a frequency of the filtered signal so as not to generate aliasing of the input signal and the filtered signal; and adding the frequency-shifted signal to the input signal.

According to yet another aspect of the present invention, there is provided a method of reconstructing a high frequency part of a second signal, the method comprising: generating a cosine signal; first multiplying an input signal by the cosine signal; first low-pass filtering the multiplied signal; and second multiplying the first low-pass filtered signal by the cosine signal.

BRIEF DESCRIPTION OF THE DRAWINGS

The above and other features and advantages of the present invention will become more apparent by describing in detail exemplary embodiments thereof with reference to the attached drawings in which:

FIG. 3 is a flow chart illustrating a method of reconstructing the high frequency part of a first signal according to a third exemplary embodiment of the present invention; and FIG. 4 is a flow chart illustrating a method of reconstructing the high frequency part of a second signal according to a fourth exemplary embodiment of the present invention.

DETAILED DESCRIPTION OF THE INVENTION

The present invention will now be described more fully with reference to the accompanying drawings, in which exemplary embodiments of the invention are shown.

Figure 1A:
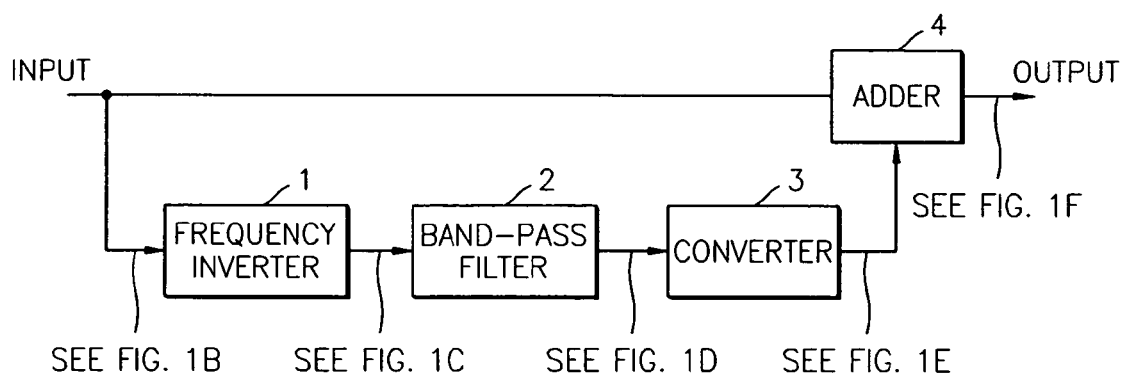
FIG. 1A is a block diagram of an apparatus for reconstructing the high frequency part of a first audio signal according to a first exemplary embodiment of the present invention.

FIG. 1A is a block diagram of an apparatus for reconstructing the high frequency part of a first audio signal according to a first exemplary embodiment of the present invention.

Referring to FIG. 1A, the apparatus includes a frequency inverter 1, a band-pass filter 2, a converter 3, and an adder 4. FIGS. 1B-1F schematically show signal spectrums at different processing stages.

Figure 1B:
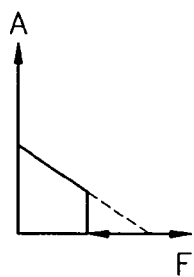
FIG. 1B shows the spectrum of an input signal.
Figure 1C:
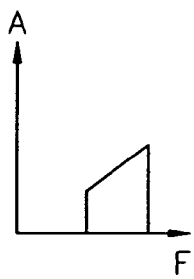
FIG. 1C shows the spectrum of an output of a frequency inverter.
Figure 1D:
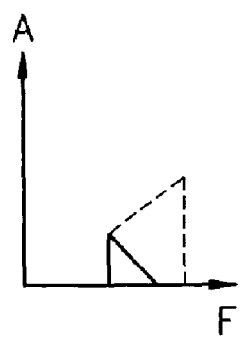
FIG. 1D shows the spectrum of an output of a band-pass filter.
Figure 1E:
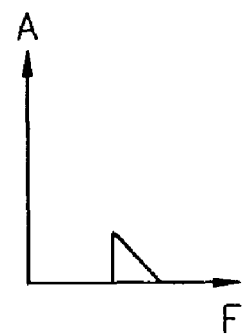
FIG. 1E shows the spectrum of an output of a converter.
Figure 1F:
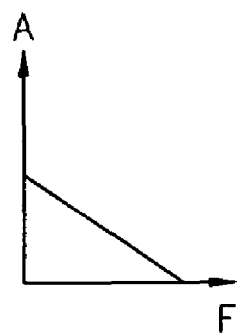
FIG. 1F shows the spectrum of an output of an adder.

FIGS. 1A-1F demonstrate the main idea of using spectrum inversion for the reconstruction of the missed high-frequency part. Input signal goes through the frequency inverter 1 so that every sample of the input audio signal changes in sign. FIG. 1B schematically shows the spectrum of the input discrete audio signal. The quantity of the audio signal amplitude is on axis A and the frequency is on axis F. The dotted line denotes the absent high frequency part that is required to be reconstructed. Spectrum at the output of the frequency inverter 1 is shown by FIG. 1C. This signal is used as basis to generate a correcting signal. As a rule, audio signal energy decreases with a frequency increase, but for the signal with the inverted spectrum, this theory does not apply, and the signal needs correction, i.e., depletion of the high-frequency part, for the signal spectrum to look natural. The band-pass filter 2 is used for high-frequency part depletion. This filter has variable bandwidth in order to provide cut-off of the excessively acute high-frequency part present in the signal, which is formed after the input signal inversion. The signal spectrum at the output of the band-pass filter 2 is shown in note FIG. 1D. The dotted line shows the filtered part of the signal spectrum. After the band-pass filter 2, the signal is shifted according to the frequency, using the converter 3 in a way to prevent aliasing of correcting and reconstructing signals, as shown by FIG. 1E. The signal at the converter output is the correcting signal and is added to the input signal (a) by the adder. The spectrum of the constructed signal is shown by FIG. 1F. It is assumed that the frequency band is known at any point of time: such information can be received directly from a decoder (not shown) during input signal decoding. How the frequency inverter 1 and the band-pass filter 2 can be implemented at such conditions is discussed below.

Figure 2:
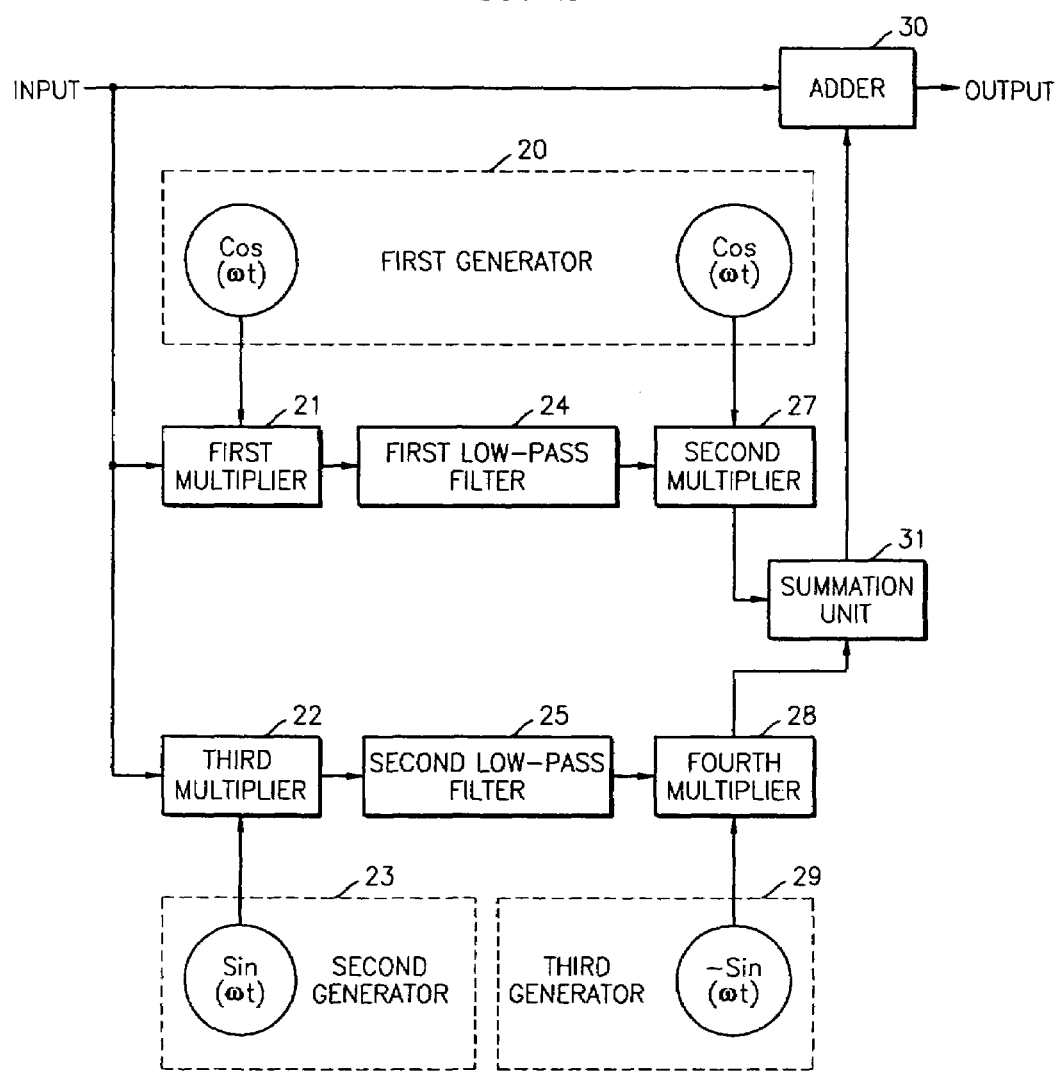
FIG. 2 is a block diagram of an apparatus for reconstructing the high frequency part of a second audio signal according to a second exemplary embodiment of the present invention.

FIG. 2 is a block diagram of an apparatus for reconstructing the high frequency part of second audio signal according to a second exemplary embodiment of the present invention.

Referring to FIG. 2, the apparatus includes a first generator 20, a first multiplier 21, a third multiplier 22, a second generator 23, a first low-pass filter 24, a second low-pass filter 25, a second multiplier 27, a fourth multiplier 28, an adder 30, and a summation unit 31.

FIG. 2 represents the modified schematics of a reconstructing heterodyne filter that performs frequency inversion and also filtration. Such combination of operations is possible because of the fact that the heterodyne filter simulates an input signal by using a complex signal (complex exponent), and spectrum inversion, as it is known, can be estimated as a modulation result. How the signal spectrum is converted in this apparatus is discussed below. Thus, this apparatus implements the complex signal notation, and the complex spectrum will be examined everywhere. The form of the amplitude spectrum of the input signal is demonstrated in FIG. 1B, where, for simplicity, the symmetric part of the spectrum is not shown.

The input signal is transferred to the third multiplier 22 input and multiplied by sin(ωt), formed by the second generator 23. Where t is time, ω=2πf, and f is the cut-off frequency of the input signal that can vary with time. This phase implements multiplication of the real signal by complex exponent according to the Euler equation:

$$E^{j\omega t}=\cos(\omega t)+j\cdot\sin(\omega t) \quad (1),$$

where j is the imaginary unit.

Real and imaginary parts of the received signal are sent to the inputs of the first low-pass filter 24 and the second low-pass filter 25, accordingly. The first low-pass and second low-pass filters 24 and 25 are identical ones. The real signal part is multiplied in the first multiplier 21 by cos(ωt) formed by the first generator 20, and the imaginary part is transferred to the fourth multiplier 28 input, where it is multiplied by −sin(ωt) formed by the third generator 29 that withdraws the imaginary information. Signals from the outputs of the second and fourth multipliers 27 and 28 are added in the summation unit 31. The second and fourth multipliers 27, 28, and the summation unit 31 implement multiplication algorithm of complex signal by using the complex exponent $e^{j\omega t}$ and receiving the real part from the produced complex signal.

$$Re[(x+j\cdot y)\cdot e^{j\omega t}]=Re[(x+j\cdot y)\cdot(\cos(\omega t)+j\cdot\sin(\omega t))]=x\cdot\cos(\omega t)-y\cdot\sin(\omega t) \quad (2).$$

Generated signal is added to the input signal in the adder 30.

Thus, the apparatus design for implementing the proposed method of reconstructing the high frequency part of audio signal includes the adder 30, the output of which is the output of the apparatus. The first input of the adder 30 is connected to the source requiring signal adjustment, i.e., system input, and the second input of the adder 30 is connected to the output of the summation unit 31 output. Inputs of the second and fourth multipliers 27 and 28 are connected to the outputs of the first and second low-pass filters 24 and 25. First low-pass filter 24 input is connected to the first multiplier 21 output, and the second low-pass filter 25 input is connected to the third multiplier 22 output. Inputs of the first and third multipliers 21 and 22 are connected to the system input. The inputs of the first and second multipliers 21 and 27 are connected to the first generator 20 output, and inputs of the third and fourth multipliers 22 and 28 are connected to outputs of the second generator 23 and the third generator 29. Simplicity of the design of the apparatus for implementing the proposed reconstruction method of the audio signal high-frequency part allows its use even for a home appliance, providing high-quality reproduction of digital recording received via channels with narrow bandwidth.

Here, physiological peculiarities of perception by listeners of different ranges of audio signal frequency spectrum were taken into account. The performed experiments demonstrated that fully mechanical, i.e., identical with the original, reconstruction of a high-frequency part of noise spectrum, is not required as a rule. The higher the frequency of perceptible sound, the smaller value there is in the accuracy of reconstructing frequencies, and for realistic sound transmission, it is sufficient to reconstruct its energetic part. In the majority of cases, it is sufficient to get a correcting signal with energy level on high frequencies nearly adequate to the original signal. Besides that, near frequencies energies of an audio signal are correlated between each other. Therefore, in order to solve the problem in audio signal reconstruction for perception close to the original signal, the high frequency part is generated from the remaining low-frequency part by the spectrum inversion of the original signal in the time domain. Thus, a distinguishing feature of the proposed method in comparison with U.S. Pat. No. 5,893,068 is the generation of the high-frequency part by the spectrum inversion of the input digital signal. The spectrum inversion in the digital signal is executed by changing the sign of every sample. Signal with inverted spectrum is filtered and shifted by a frequency in order to avoid an overlap of the original and the correcting signal. Due to this, the main part of spectrum of the input signal remains unaltered.

FIG. 3 is a flow chart illustrating a method of reconstructing the high frequency part of a first signal according to a third exemplary embodiment of the present invention.

Referring to FIG. 3, in step 301, the frequency of an input signal is inverted. Here, the frequency of the input signal is inverted by multiplying the input signal by an external sine and cosine signal having the same frequency as the cut-off frequency of the input signal. In step 302, the high frequency part of the inverted signal is filtered. In step 303, the frequency of the filtered signal is shifted so as not to generate aliasing of the input signal and the filtered signal. Here, the frequency of the filtered signal is shifted by multiplying the filtered signal by the external sine and cosine signal having the same frequency as the cut-off frequency of the input signal. In step 304, the shifted signal is added to the input signal. Here, the signal is generally an audio signal.

FIG. 4 is a flow chart illustrating a method of reconstructing the high frequency part of the second signal according to a fourth exemplary embodiment of the present invention.

Referring to FIG. 4, in step 401, cosine signal is generated. In step 402, the cosine signal is multiplied by an input signal. In step 403, the multiplied signal is low-pass filtered. In step 404, the low-pass filtered signal is multiplied by the generated cosine signal. In step 405, sine signal is generated. In step 406, the sine signal is multiplied by the input signal. In step 407, the multiplied signal is low-pass filtered. In step 408, the negative sine signal is generated. In step 409, the low-pass filtered signal is multiplied by the generated negative sine signal. In step 410, the multiplied signal of step 404 and the multiplied signal of step 409 are summed up. In step 411, the summed signal is added to the input signal. Here, the signal is generally an audio signal.

The present invention may be embodied in a general purpose digital computer by running a program from a computer usable medium, including but not limited to storage media such as magnetic storage media (e.g., ROMs, floppy discs, hard discs, etc.), optically readable media (e.g., CD-ROMs, DVDs, etc.) and carrier waves (e.g., transmissions over the Internet).

As described above, the present invention reconstructs the high frequency part of an audio signal, enabling hearing perception close to the original signal. The present invention, as in U.S. Pat. No. 5,893,068, reconstructs the lost high-frequency part from the remaining low-frequency part of spectrum but, in contrast to U.S. Pat. No. 5,893,068, it does not require signal transfer in the frequency area (Fourier transformation and so on). Therefore, the method can be implemented by uncomplicated devices, providing relatively high quality reconstructed signal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for reconstructing a high frequency part of a first signal, the apparatus comprising:
    a frequency inverter which inverts a frequency of an input signal to generate a frequency-inverted input signal;
    a band-pass filter which filters a high frequency part of the frequency-inverted input signal to generate a filtered signal;
    a converter which shifts a frequency of the filtered signal so as not to generate an aliasing of the input signal and the filtered signal to generate a frequency-shifted signal; and an adder which adds the frequency-shifted signal to the input signal.

2. The apparatus of claim 1, wherein the input signal comprises an audio signal.

3. The apparatus of claim 1, wherein the frequency inverter inverts the frequency of the input signal by multiplying the input signal by an external sine signal and an external cosine signal, the external sine signal and the external cosine signal having a first frequency substantially equivalent to a cut-off frequency of the input signal.

4. The apparatus of claim 1, wherein the converter shifts the frequency of the filtered signal by multiplying the filtered signal by an external sine signal and an external cosine signal, the external sine signal and the external cosine signal having a first frequency substantially equivalent to a cut-off frequency of the input signal.

5. An apparatus for reconstructing a high frequency part of a first signal, the apparatus comprising:
    a first generator which generates a cosine signal;
    a first multiplier which multiplies an input signal by the cosine signal to generate a first multiplied signal;
    a first low-pass filter which low-pass filters the, first multiplied signal to generate a first low-pass filtered signal;
    a second multiplier which multiplies the first low-pass filtered signal by the cosine signal to generate a second multiplied signal;
    a second generator which generates a sine signal;
    a third multiplier which multiplies the input signal by the sine signal to generate a third multiplied signal;
    a second low-pass filter which low-pass filters the third multiplied signal to generate a second low-pass filtered signal;
    a third generator which generates a negative sine signal;
    a fourth multiplier which multiplies the second low-pass filtered signal by the negative sine signal to generate a fourth multiplied signal;
    a summation unit which sums the second multiplied signal obtained by the second multiplier and the fourth multiplied signal obtained by the fourth multiplier to generate a summed signal; and
    an adder which adds the summed signal to the input signal.

6. The apparatus of claim 5, wherein the signal comprises an audio signal.

7. A method of reconstructing a high frequency part of a first signal, the method comprising:
    inverting a frequency of an input signal to generate a frequency-inverted input signal;
    filtering a high frequency part of the frequency-inverted input signal to generate a filtered signal;
    shifting a frequency of the filtered signal so as not to generate aliasing of the input signal and the filtered signal to generate a frequency-shifted signal; and
    adding the frequency-shifted signal to the input signal.

8. The method of claim 7, wherein the input signal comprises an audio signal.

9. The method of claim 7, wherein the operation of inverting inverts the frequency of the input signal by multiplying the input signal by an external sine signal and an external cosine signal, the external sine and external cosine signals having a first frequency substantially equivalent to a cut-off frequency of the input signal.

10. The method of claim 7, wherein the operation of shifting step shifts the frequency of the filtered signal by multiplying the filtered signal by an external sine signal and an external cosine signal, the external sine and the external cosine signals having a first frequency substantially equivalent to a cut-off frequency of the input signal.

11. A method of reconstructing a high frequency part of a first signal, the method comprising:
    generating a cosine signal;
    first multiplying an input signal by the cosine signal to generate a first multiplied signal; first low-pass filtering the first multiplied signal to generate a first low-pass filtered signal;
    second multiplying the first low-pass filtered signal by a cosine signal to generate a second multiplied signal;
    generating a sine signal;

third multiplying the input signal by the sine signal to generate a third multiplied signal; second low-pass filtering the third multiplied signal to generate a second low-pass filtered signal;

generating a negative sine signal;

fourth multiplying the second low-pass filtered signal by the negative sine signal to generate a fourth multiplied signal;

summing the second multiplied signal and the fourth multiplied signal to generate a summed signal; and adding the summed signal to the input signal.

12. The method of claim 11, wherein the input signal comprises an audio signal.

13. A computer-readable recording medium on which a computer program for executing the method of claim 7 is recorded.

14. A computer-readable recording medium on which a computer program for executing the method of claim 11 is recorded.

15. The apparatus of claim 1, wherein the sine signal is input directly to the third multiplier from an output of the second generator, second low-pass filtered signal is input directly to the fourth multiplier from an output of the second low-pass filter, and the negative sine signal is input directly to the fourth multiplier from an output of the third generator.

* * * * *